(12) United States Patent
Schleuning et al.

(10) Patent No.: US 8,638,831 B2
(45) Date of Patent: Jan. 28, 2014

(54) OPTICAL PUMPING OF A SOLID-STATE GAIN-MEDIUM USING A DIODE-LASER BAR STACK WITH INDIVIDUALLY ADDRESSABLE BARS

(71) Applicant: Coherent, Inc., Santa Clara, CA (US)

(72) Inventors: David Schleuning, Oakland, CA (US); Mark M. Gitin, Mountain View, CA (US); R. Russel Austin, La Veta, CO (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/760,222

(22) Filed: Feb. 6, 2013

(65) Prior Publication Data

US 2013/0148679 A1    Jun. 13, 2013

Related U.S. Application Data

(62) Division of application No. 12/852,843, filed on Aug. 9, 2010, now Pat. No. 8,391,328.

(51) Int. Cl.
*H01S 3/04*     (2006.01)
*H01S 5/00*    (2006.01)

(52) U.S. Cl.
USPC ............... 372/50.12; 372/34; 372/50.121; 372/50.122

(58) Field of Classification Search
USPC .............. 372/34, 36, 50.12, 50.121, 50.122
See application file for complete search history.

(56) References Cited

U.S. PATENT DOCUMENTS

| | | | |
|---|---|---|---|
| 6,451,152 | B1 | 9/2002 | Holmes et al. |
| 6,603,498 | B1 | 8/2003 | Konnunaho et al. |
| 2008/0089371 | A1 | 4/2008 | Reichert |
| 2010/0183039 | A1 | 7/2010 | Schleuning |

OTHER PUBLICATIONS

Non Final Office Action received for U.S. Appl. No. 12/852,843, mailed on Aug. 15, 2012, 10 pages.
Notice of Allowance received for U.S. Appl. No. 12/852,843, mailed on Dec. 3, 2012, 9 pages.

*Primary Examiner* — Armando Rodriguez
(74) *Attorney, Agent, or Firm* — Morrison & Foerster LLP

(57) ABSTRACT

A diode-laser bar stack includes a plurality of diode-laser bars having different temperature dependent peak-emission wavelengths. The stack is arranged such that the bars can be separately powered. This allows one or more of the bars to be "on" while others are "off". A switching arrangement is described for selectively turning bars on or off, responsive to a signal representative of the temperature of the diode-laser bar stack, for providing a desired total emission spectrum.

12 Claims, 7 Drawing Sheets

(Prior-Art)

| Temp (°C) | Diode-Laser Bar Number | | | | |
|---|---|---|---|---|---|
| | 12A | 12B | 12C | 12D | 12E |
| Up to 25 | 0 | 0 | 1 | 1 | 1 |
| > 25 to 35 | 1 | 0 | 0 | 1 | 1 |
| > 35 to 45 | 1 | 1 | 0 | 0 | 1 |
| > 45 to 55 | 1 | 1 | 1 | 0 | 0 |
| > 55 | 1 | 1 | 1 | 1 | 0 |

OPTICAL PUMPING OF A SOLID-STATE GAIN-MEDIUM USING A DIODE-LASER BAR STACK WITH INDIVIDUALLY ADDRESSABLE BARS

PRIORITY

This application is a divisional of U.S. patent application Ser. No. 12/852,843, filed Aug. 9, 2010.

TECHNICAL FIELD OF THE INVENTION

The present invention relates in general to solid-state lasers pumped with diode-laser radiation. The invention relates to such lasers wherein the diode-laser radiation is provided by a stack of diode-laser bars.

DISCUSSION OF BACKGROUND ART

Radiation from a diode-laser or an array thereof is now extensively used for optical pumping of lasers having a solid-state gain-medium, in particular lasers wherein the wherein the gain-medium is neodymium-doped yttrium aluminum garnet (Nd:YAG) or neodymium-doped yttrium ortho-vanadate (Nd:YVO$_4$). Diode-laser radiation can be generated with efficiencies up to about 50% or greater. The wavelength of the radiation (emission-wavelength) can be selected, depending on the composition of the diode-laser materials, to match the peak-absorption wavelengths of the gain-media. The bandwidth of the radiation is comparable with the FWHM bandwidth of absorption peaks in the absorption spectrum of the gain-media.

A single diode-laser does not provide adequate power for pumping a high-power-solid state laser. A two-dimensional array of diode-lasers is required to pump really high-power lasers, for example, lasers having a peak power of about 200 W or greater. Such lasers are typically operated in a repetitively pulsed manner by driving the diode-laser array in a repetitively pulsed manner.

A two-dimensional array of diode-lasers is typically made by stacking one-dimensional diode-laser arrays known in the art as diode-laser bars. A diode-laser bar includes a plurality of individual diode-lasers (emitters) formed in semiconductor layers epitaxially-grown on a single elongated substrate. The substrate or bar (cut from a disk substrate) typically has a length of about 1 centimeter (cm), a width of about 1 millimeter (mm), and a height of about 140 micrometers ($\mu$m) or less. The emitters emit along a propagation-axis in the width direction of the bar, and have slow-axis (low beam-divergence) in the length direction of the bar and a fast-axis (high beam-divergence) perpendicular to the slow axis, i.e., in the height direction of the bar. Current is typically passed through the bars electrically connected in series, with emitters in any one bar connected in parallel One drawback of diode-lasers is that the emission wavelength of a diode-laser or diode-laser bar is relatively strongly dependent on the diode-laser temperature. By way of example, for GaAs P/InGaAs diode-lasers, peak emission wavelength varies by about 0.3 nanometers (nm) per °C. The diode-laser bar temperature, absent effective cooling, depends, inter alia, on the current passed through the diode-laser bar and the pulse-duration with which the diode-laser bar is driven. In a diode-laser bar stack (two-dimensional diode-laser array) the total emission from the stack is brighter the closer together the one dimensional-emitter arrays of the bars are in the stack.

With a close-stacking, providing equal cooling of the bars is extremely difficult if not impossible, as only outermost bars of the stack can be contacted by massive cooling members. This means that bars in the center of a stack will get hotter than bars at or near the top or bottom of the stack making wavelength control of individual bars very difficult.

In U.S. Patent Application Publication No. 2010/0183039, assigned to the assignee of the present invention, and the complete disclosure of which is hereby incorporated herein by reference, a diode-laser bar stack is described in which diode-laser bars are selected with different emission wavelengths at the same temperature and located in the stack such that at a nominal operating condition of the stack, where the bars reach different temperatures, the total emission of the stack has a bandwidth significantly greater than that of any one bar in the stack. In this way, it can be arranged that the absorption peak of a gain-medium being pumped can lie within the total emission bandwidth at any anticipated range of operating conditions (temperatures) of the stack. This eliminates a need to control the stack temperature by active means.

FIG. 1 schematically illustrates a prior-art diode-laser pumping arrangement 10. The arrangement is described in detail in the above-referenced patent publication. The arrangement includes a stack 11 of six diode-laser bars 12A, 12B, 12C, 12D, 12E, and 12F. Each bar includes a heterostructure 14 grown on a substrate 16. Diode-laser emitters (not shown) are designated within the heterostructure, as is known in the art. The fast-axis, slow-axis, and emission-direction (propagation-axis) are indicated in FIG. 1 by axes Y, X, and Z, respectively. The bars are soldered one to the next, with the epitaxial-layer side of one bar soldered to the substrate side of an adjacent bar such that the emitters are connected in series-parallel.

Stack 11 is sandwiched between a heat-sink member 18 and a heat-sink member 20, with both heat-sink members being supported on a base 22. There is a space 24 between the stack and the base. The epitaxial side 14F of bar 12F is in thermal contact with heat-sink member 20. The substrate side 16A of bar 12A is in thermal contact with heat-sink member 18. The diode-laser bars are in thermal contact with each other, with the epitaxial side of one in thermal contact with the substrate side of the next except of bar 12F. Heat-sink members 18 and 20 are insulated from base 22 by insulating layers 17 and 19 respectively. Current from a pulsed power supply (not shown) for driving the stack is connected to the stack by attaching a positive lead to heat-sink member 20 and a negative lead to heat-sink member 18.

FIG. 2 is a graph schematically illustrating the calculated total emission spectrum (solid curve) of the stack of FIG. 1 overlaid with the absorption spectrum (dashed curve) of Nd:YAG. It is assumed that the stack is driven in a pulsed mode with a pulse duration of 250 microseconds ($\mu$s), a pulse-repetition frequency (PRF) of 2 Hertz (Hz) and an average power of 200 Watts (w) per bar. It is assumed that the nominal emission-wavelengths of bars 12A, 12B, 12C, 12D, 12E, and 12F are 801.71 nm, 808.10 nm, 804.49 nm, 808.10 nm, 804.43 nm, and 801.05 nm, respectively.

The nominal bandwidth of the total emission from the stack is about 10.0 nm, with the center wavelength close to the 808 nm absorption peak of the Nd:YAG absorption spectrum. In theory at least, the average temperature of the six bars could vary by about ±10° C. from the temperature providing the emission spectrum of FIG. 2, with the 808 nm absorption peak still remaining within the total emission bandwidth.

A particular drawback of this prior-art stack arrangement is that only a fraction of the total emission power provided by the stack (about 25% in the overlay of FIG. 1) is absorbed by the gain-medium. This considerably reduces the electrical to optical pumping efficiency of the stack. There is a need to provide a diode-laser bar stack for optical pumping that is capable of operating over a relatively wide uncontrolled temperature range but will deliver radiation in only a relatively narrow wavelength range around a gain-medium absorption peak of interest.

SUMMARY OF THE INVENTION

In one aspect of the invention, electro-optical apparatus comprises a plurality of diode-laser bars positioned one on another to form a diode-laser bar stack, with at least one of the diode-laser bars having a peak-emission emission wavelength that is significantly different from the peak-emission wavelength of at least one of the others. The diode-laser bar stack is arranged such that each of the diode-laser bars can be separately powered independent of the others.

The term significant, here, means that the wavelength difference is greater than would be encountered in normal manufacturing tolerances for diode-laser bars. When provided with a power supply and an appropriate switching arrangement, the stack can be driven with a selected one or more of the bars powered and the remainder not powered.

In an example of the apparatus used in conjunction with the switching arrangement for pumping a laser gain-medium, each of the plurality of diode-laser bars has a different peak-emission wavelength at a given temperature. The peak-emission wavelengths are directly dependent on the diode-laser bar temperature, and the peak-emission wavelengths of the diode-laser bars are selected such that as the temperature of the diode-laser bar stack increases through a predetermined range at least one of the diode laser bars will have a peak-emission wavelength falling within a predetermined absorption band in the absorption spectrum the gain-medium. The temperature of the laser bar stack is monitored and the monitored temperature is used by the switching arrangement to determine which of the diode-laser bars should be turned on and which should be turned off at any given temperature in the range.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
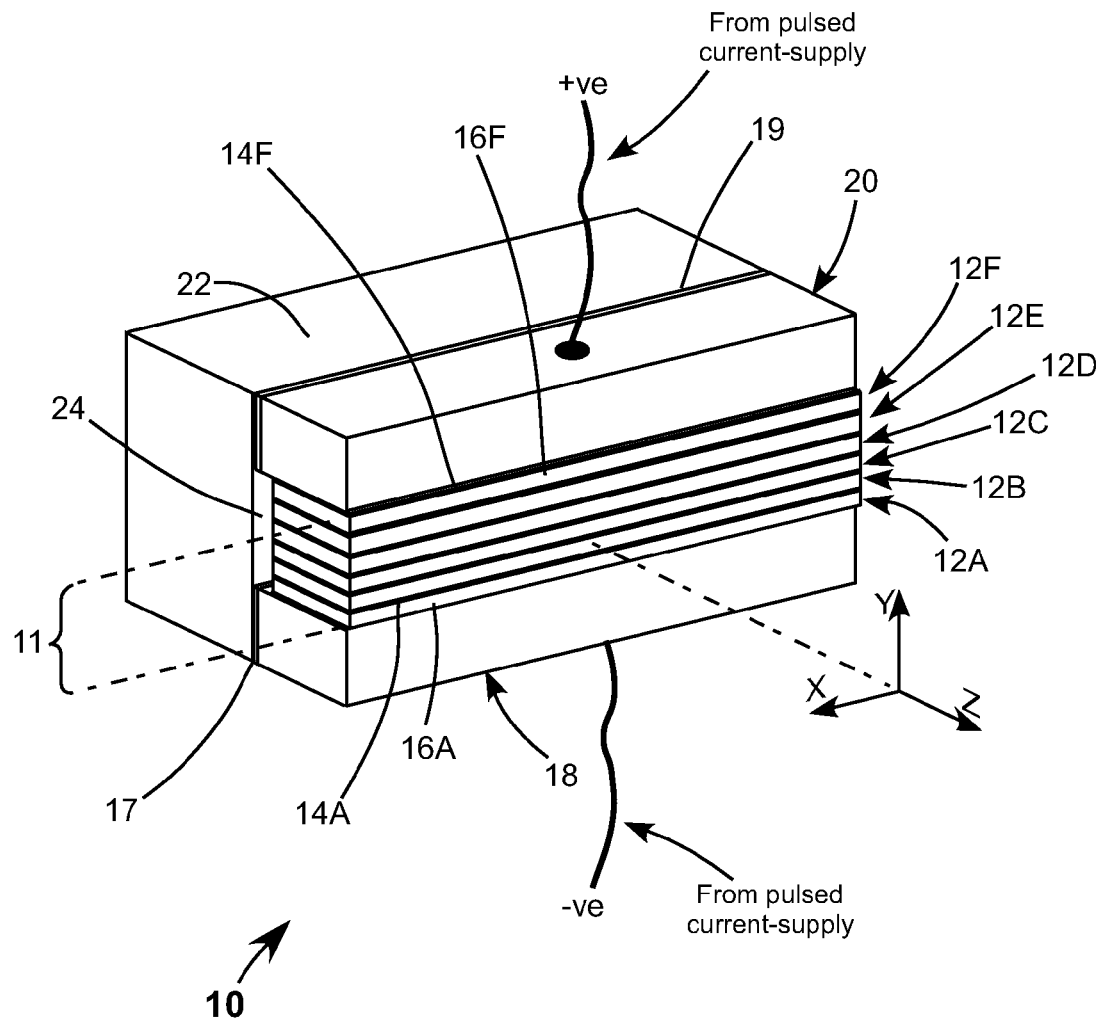
FIG. 1 schematically illustrates a prior-art stack of six diode-laser bars connected in series with a current-supply and wherein at least one of the diode-laser bars has an emission wavelength different from one or more of the others.
Figure 3:
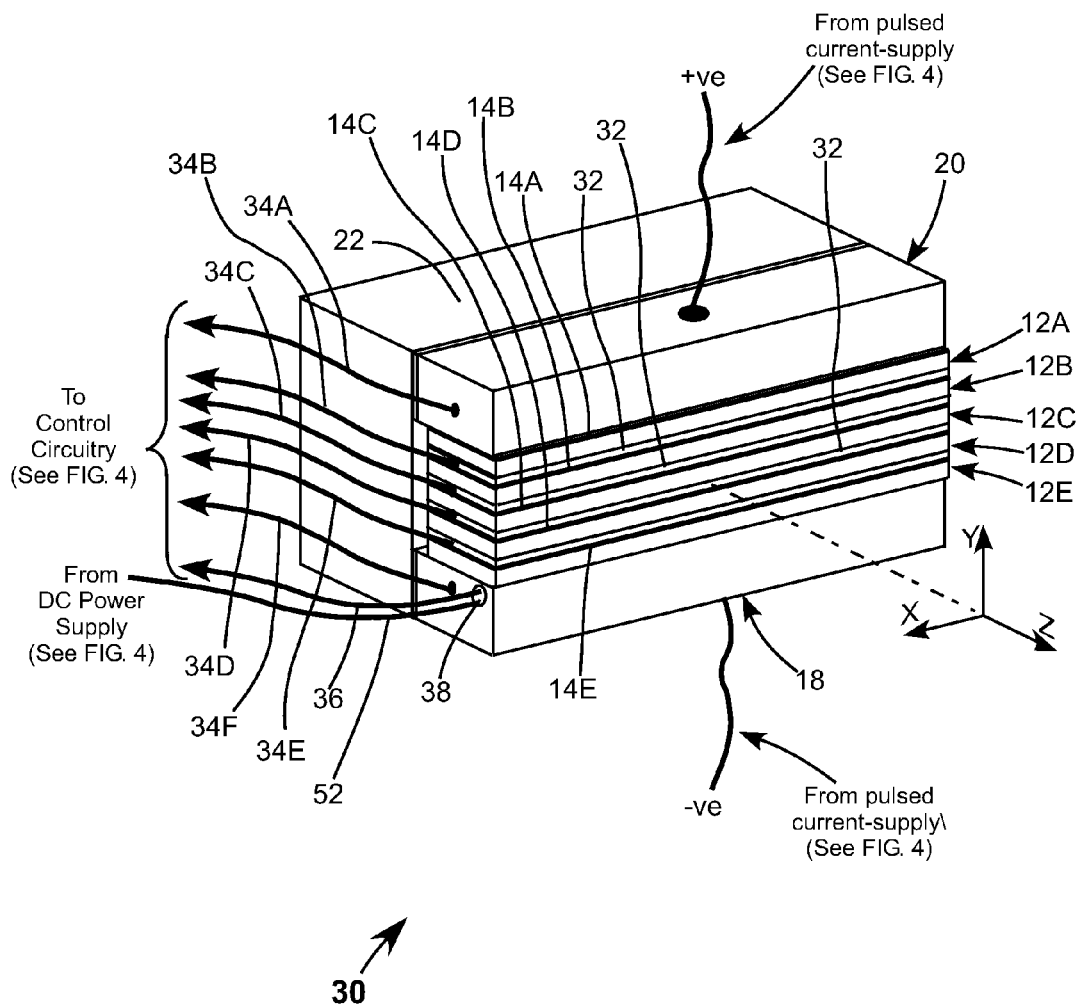
FIG. 3 is three-dimensional view schematically illustrates one preferred embodiment of a diode-laser bar stack in accordance with the present invention including a fast-axis stack of five diode-laser bars with electrical contact strips therebetween, electrical leads for individually addressing each of the diode-laser bars and a temperature sensor for monitoring the temperature of the diode-laser bar stack.

Continuing with reference to the drawings, wherein like components are designated by like reference numerals, FIG. 3 schematically illustrates one preferred embodiment 30 of an individually addressable diode-laser bar stack in accordance with the present invention. This diode-laser bar stack includes five diode-laser bars 12A, 12B, 12C, 12D, and 12E, having epitaxially grown semiconductor multilayers 14A, 14B, 14C, 14D, and 14E. The diode-laser bars are stacked in the fast-axis (here, the Y-axis) direction. Stack 30 is similar to the prior-art stack 10 of FIG. 1 but with important differences as follows.

Between adjacent diode-laser bars in the stack 30 is an electrical contact strip 32. This can be formed from one or more layers of electrically and thermally conductive material including solder layers. There are four electrical contact strips 32. The diode-laser bars and contact strips are sandwiched between two passive cooling-members 18 and 20. Upper and lower ones of the diode-laser bar are in thermal and electrical contact with a surface of cooling members 20 and 18, respectively.

Each contact strip 32 has an electrical lead attached thereto. The leads attached to the contact strips are designated in FIG. 3 as leads 34B, 34C, 34D, and 34E. These leads make contact to the electrical junction between diode-laser bars 12A and 12B, 12B and 12C, 12C and 12D, and 12D and 12E, respectively. There is an electrical lead 34A attached to passive cooling-member 20, and an electrical lead 34F attached to passive cooling-member 18. Together, these leads allow each diode-laser bar to be individually addressed and powered electrically. The leads can be connected with control circuitry for the diode-laser bar stack, a description of one example of which is provided further hereinbelow with reference to FIG. 4.

Means are provided for monitoring the temperature of the diode-laser bar stack. In the embodiment of FIG. 3, the temperature monitoring means are provided by a temperature sensor 38, embedded in cooling member 18 near that surface of the cooling member that is in thermal contact with diode-laser bar 12E. One preferred temperature sensor is a high-accuracy low-power digital temperature sensor model number TMP 112 available from Texas Instruments Inc. of Dallas, Tex. DC power is supplied to the sensor from a DC Power supply (not explicitly shown in FIG. 3) via a lead 52. A serial bus 36 transmits a digital signal from the temperature sensor to the above-referenced control circuitry.

Figure 4:
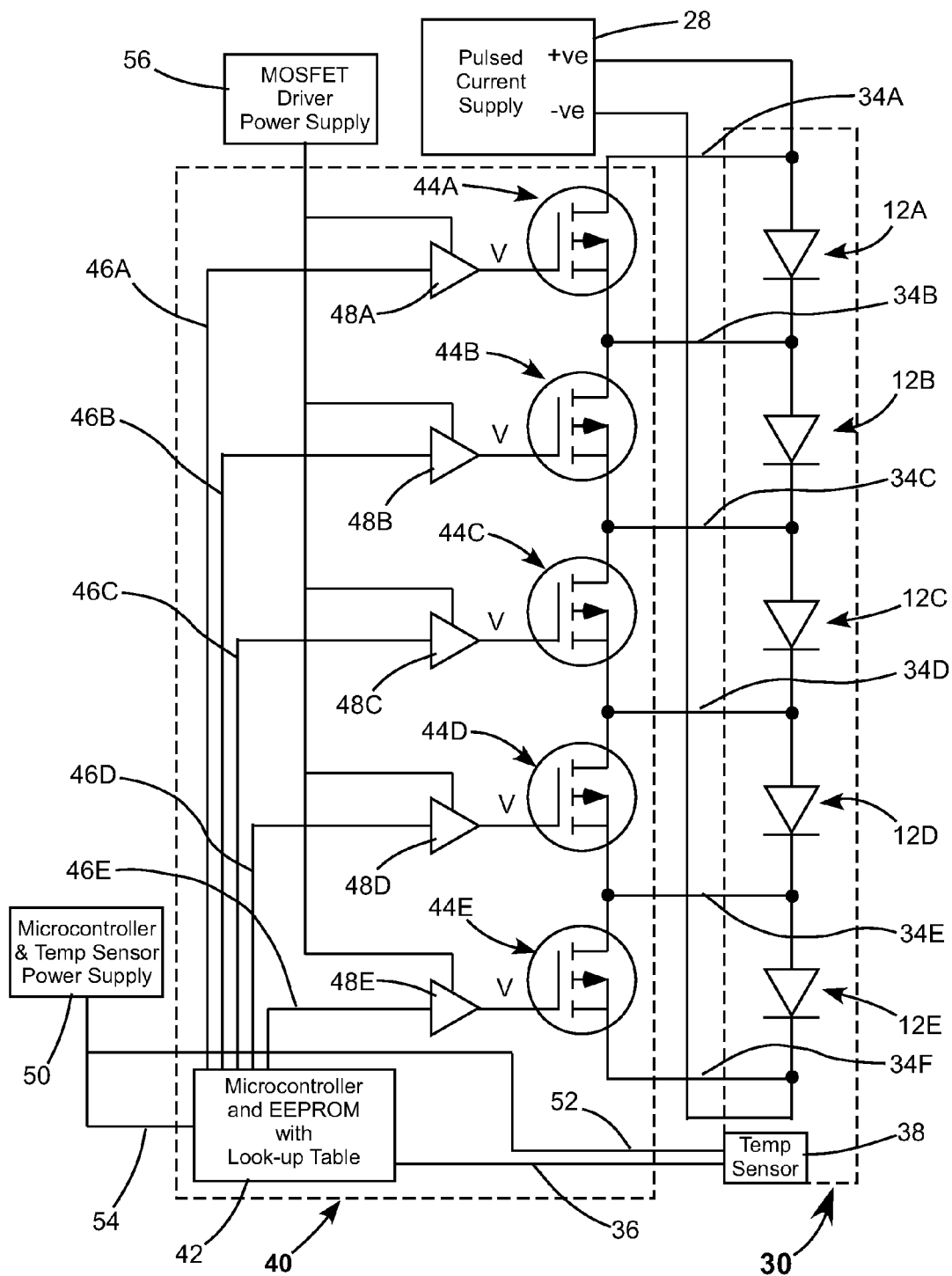
FIG. 4 is an electrical circuit diagram schematically illustrating an electrical representation of the diode-laser bar stack of FIG. 4 with the five diode-laser bars connected in series and switching electronics responsive to a signal from the temperature sensor of FIG. 3, the switch electronics including 5 MOSFETs connected in series with each other with each of the MOSFETs connected in parallel with a corresponding one of the diode-laser bars.

FIG. 4 is an electrical circuit diagram schematically illustrating an electrical representation of the diode-laser bar stack of FIG. 4 with the five diode-laser bars connected in series (stack 30) and switching electronics (control circuitry) 40 responsive to a signal from the temperature sensor of FIG. 3. Each diode-laser bar is represented by a single electrical-diode symbol for convenience of illustration. In practice each diode-laser bar includes a plurality of spaced-apart diode-laser emitters with the emitters connected in parallel.

Switching electronics 40 includes MOSFETs 44A, 44B, 44C, 44D, and 44E connected in series with each other across a current-limited power supply 28 which provides current for driving the diode-laser bars. Each of the MOSFETs is connected in parallel with a corresponding one of the diode-laser bars, which are also serially connected across power supply 28. MOSFETs 44A, 44B, 44C, 44D, and 44E are driven by MOSFET drivers 48A, 48B, 48C, 48D, and 48E, respectively, the MOSFET drivers are powered by a MOSFET driver power supply 56. One suitable MOSFET driver is a model number LTC 1693 available from LINEAR Technology Incorporated of Milpitas, Calif.

Circuitry 40 includes a Microcontroller with erasable programmable memory (EEPROM) designated, here by a single functional block 42. One suitable microcontroller is a PIC24F16KA102 microcontroller available from Microchip Technology Inc. of Chandler, Ariz. The EEPROM stores a look-up table which, based on the temperature monitored by sensor 38 to provide a digital signal for selectively turning the MOSFETS on or off as required. An example of the look-up table is described further hereinbelow. MOSFET drivers 48A, 48B, 48C, 48D, and 48E are connected to the microcontroller by leads 46A, 46B, 46C, 46D, and 46E, respectively. A DC power supply 50 supplies power to the microcontroller via lead 54 and to the temperature sensor via lead 52.

If a diode-laser bar is to be turned off (disabled) the MOSFET connected in parallel thereto must be turned on. If a MOSFET is to be turned on the microcontroller sends "high" signal (digital 1) to the appropriate MOSFET driver. On receipt of this signal the MOSFET driver applies a voltage V to the gate of the MOSFET. The Voltage must be sufficiently high that the MOSFET is turned completely on and diverts sufficient current away from the diode-laser bar that current passing through the diode-laser bar is below threshold and the diode-laser bar will not emit radiation. If a diode-laser bar is to be turned on (enabled) the parallel connected MOSFET must be turned off. In order to turn a MOSFET off the microcontroller sends a "low" signal (digital 0) to the MOSFET driver and the driver does not apply any voltage to the MOSFET gate. In this case the MOSFET does not divert any current from the diode-laser bar and sufficient current can pass the through the diode-laser bar such that the bar emits laser radiation.

Figure 4A:
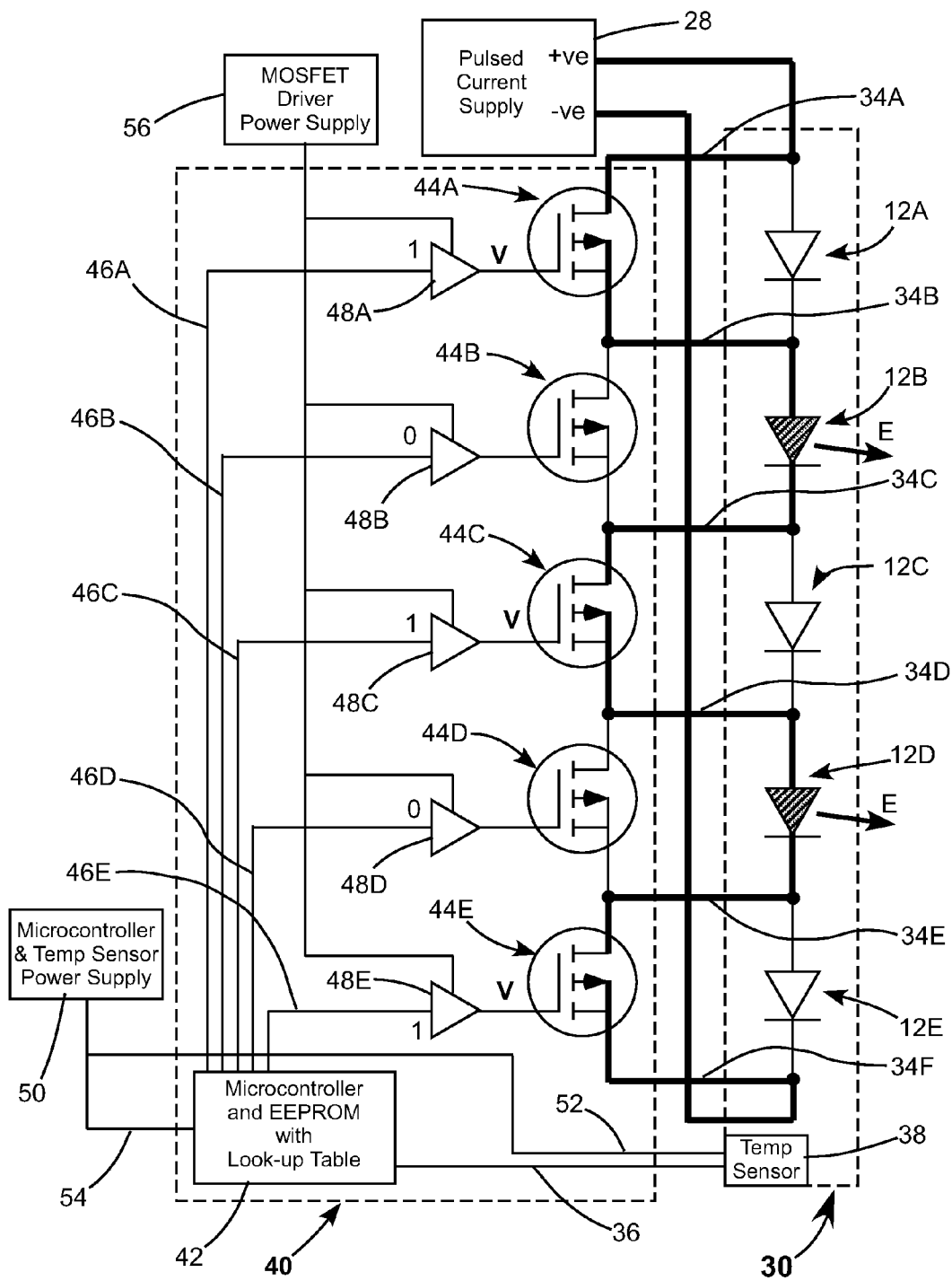
FIG. 4A is an electric diagram similar to the diagram of FIG. 4 but illustrating a current path through the MOSFETs and diode-laser bars when two of the five diode-laser bars are turned on and the remainder are turned off.

An example of the above-described switching is schematically illustrated in FIG. 4A, which is similar to the circuit diagram of FIG. 4, but wherein the current path through the MOSFET/diode-laser bar network is depicted (by three-point bold lines) for a case where diode-laser bars 12B and 12D are turned on and the remainder are turned off. The "on" (enabled) diode-laser bar symbols are shaded and the "off" diode-laser bars are unshaded. Emitted radiation is indicated by bold arrows E. Driver signals are indicated as 1 or 0.

It should be noted above that other circuit components may be required to optimize function if parasitic inductance or the like are encountered. Those skilled in the electronic art will recognize which components would be needed to deal with such parasitic. Those skilled in the art will also recognize, without further illustration or detailed description, that the microcontroller could be set up to monitor for undesirable conditions and act to put the system into a safe configuration and warn that the system is not functioning correctly.

Note that the current is delivered from the current supply in a pulsed manner, with some predetermined pulse duration and duty cycle. The nominal temperature of the diode-laser bar stack (monitored by temperature sensor 38) will depend on the magnitude of the current, the pulse duration, the duty cycle, and which combination of diode-laser bars is "on", i.e., emitting laser radiation. There may be some temperature difference between diode-laser bars that are "on" depending on the position of those bars in the stack, with a bar further from a cooling member than another having the higher temperature of the two.

Figure 5:
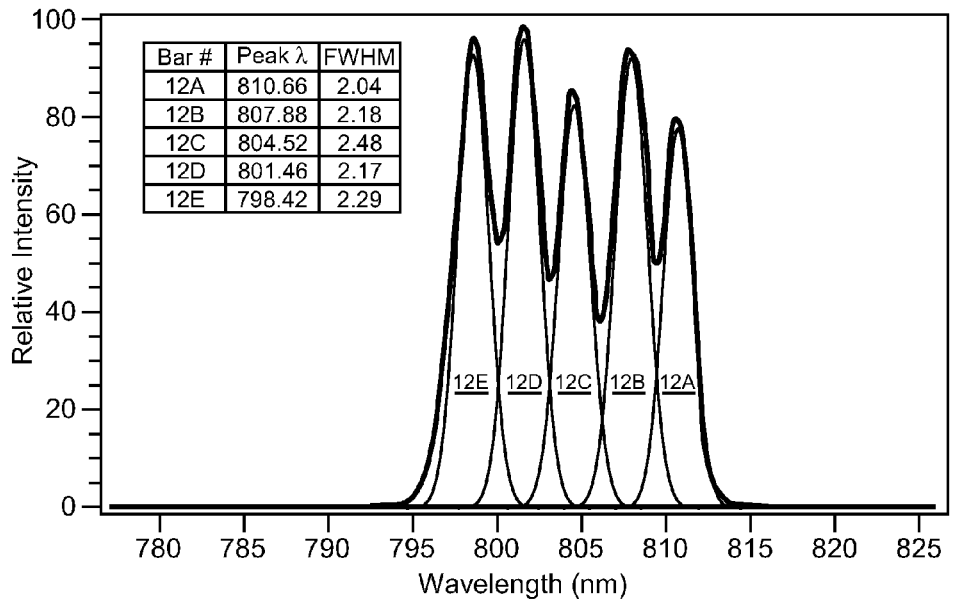
FIG. 5 is a graph schematically illustrating a measured total-emission spectrum of one example of the diode-laser bar stack of FIG. 3 and measured spectra of each one of the diode-laser bars in the stack.

FIG. 5 is a graph schematically illustrating a measured total-emission spectrum (bold curve) of one example of the diode-laser bar stack of FIG. 3 wherein each diode-laser bar has a different peak-emission wavelength from that of the others. The graph also depicts the measured spectrum (fine curve) of each one of the diode-laser bars in the stack. In this example diode-laser bars 12A, 12B, 12C, 12D, and 12E have peak-emission wavelengths (peak $\lambda$) of 810.66, 807.88, 804.52, 810.46, and 798.42, respectively at a temperature of about 30° C., i.e., the peak emission wavelengths are between about 795 nm and about 815 nm. The corresponding full-width at half-maximum (FWHM) emission-bandwidths is 2.04, 2.18, 2.48, 2.17, and 2.29, respectively, i.e., the emission bandwidths are between about 2.0 nm and about 2.5 nm. The peak-emission wavelengths are spaced apart by between about 2.5 nanometers and about 3.1 nanometers.

Figure 6:
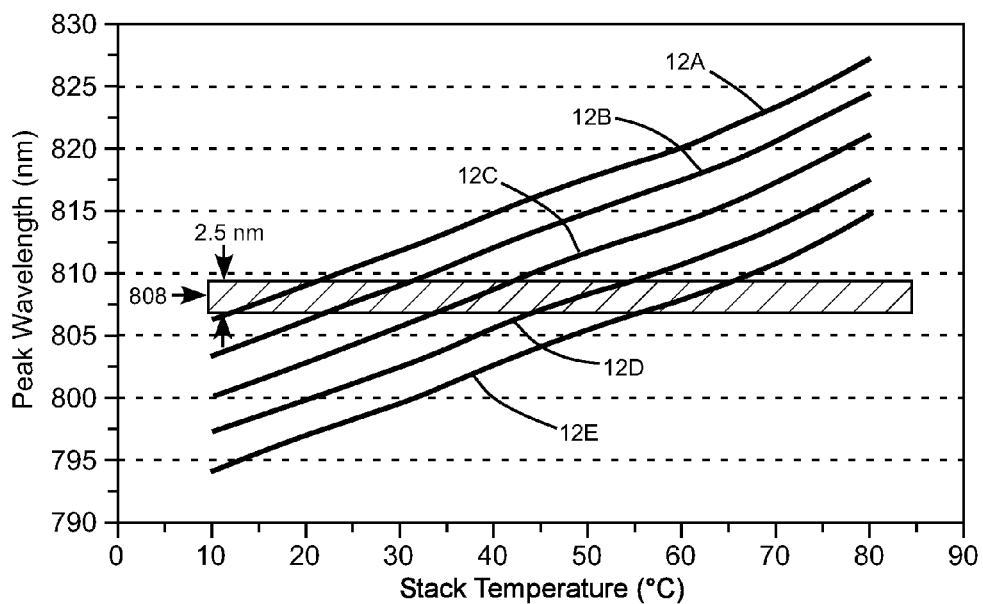
FIG. 6 is a graph schematically illustrating the measured peak-emission wavelength as a function of temperature of each of the diode-lasers bars in the example of FIG. 5.

FIG. 6 is a graph schematically illustrating measured curves (system calibration curves) of peak-emission wavelength as a function of temperature. An elongated, rectangular, shaded area on the graph represents a peak emission of 808 nm with a FWHM of 2.5 nm.

Figure 2:
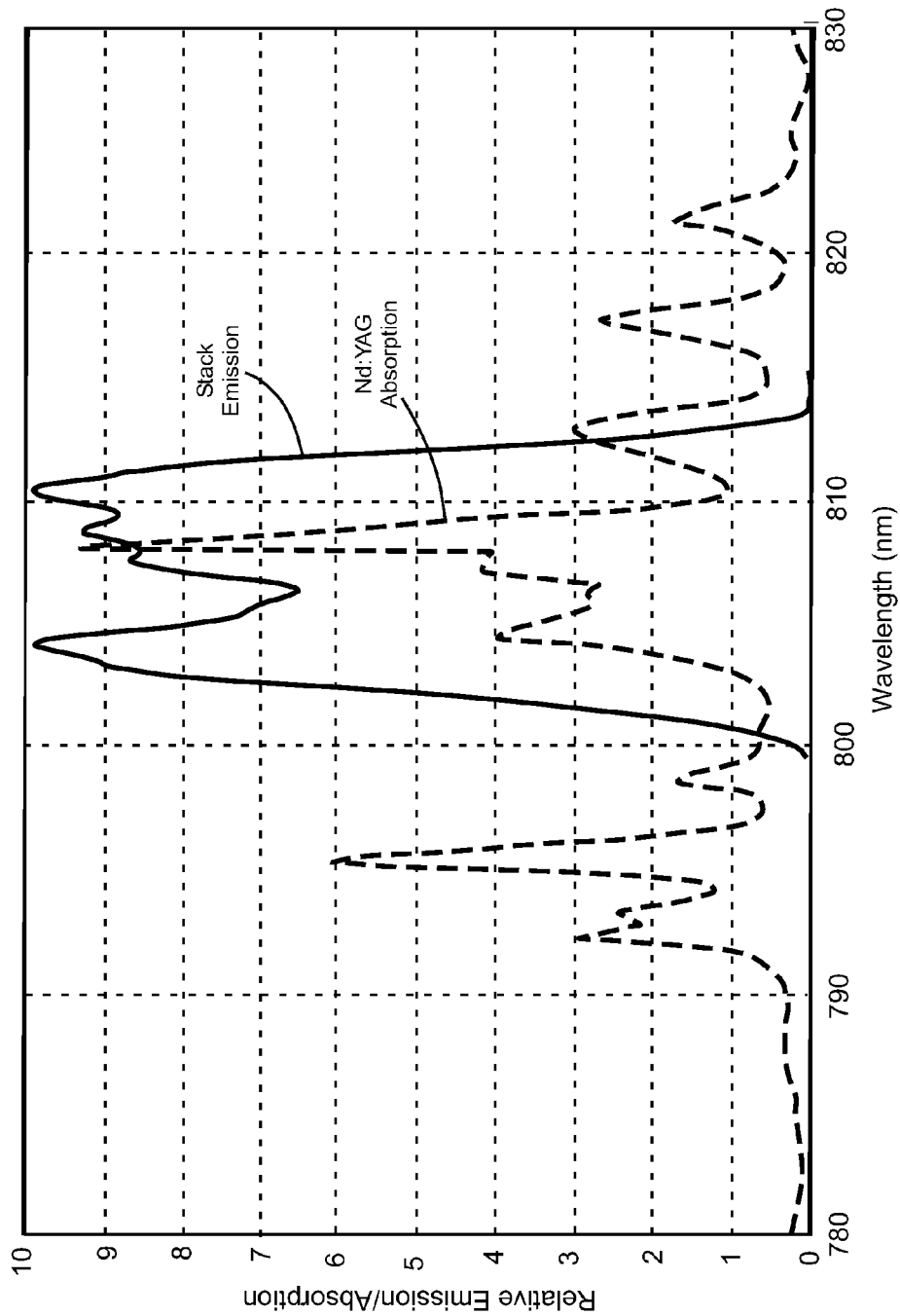
FIG. 2 is a graph schematically illustrating the absorption spectrum of Nd:YAG overlaid by the emission spectrum of an example of the diode-laser bar stack of FIG. 1 wherein the stack is driven in a pulsed mode at 200 Watts per bar output, with the bars having nominal emission wavelengths of 801.71 nm, 808.10 nm, 804.49 nm, 808.10 nm, 804.43 nm, and 801.05 nm.
Figures 7, 8:
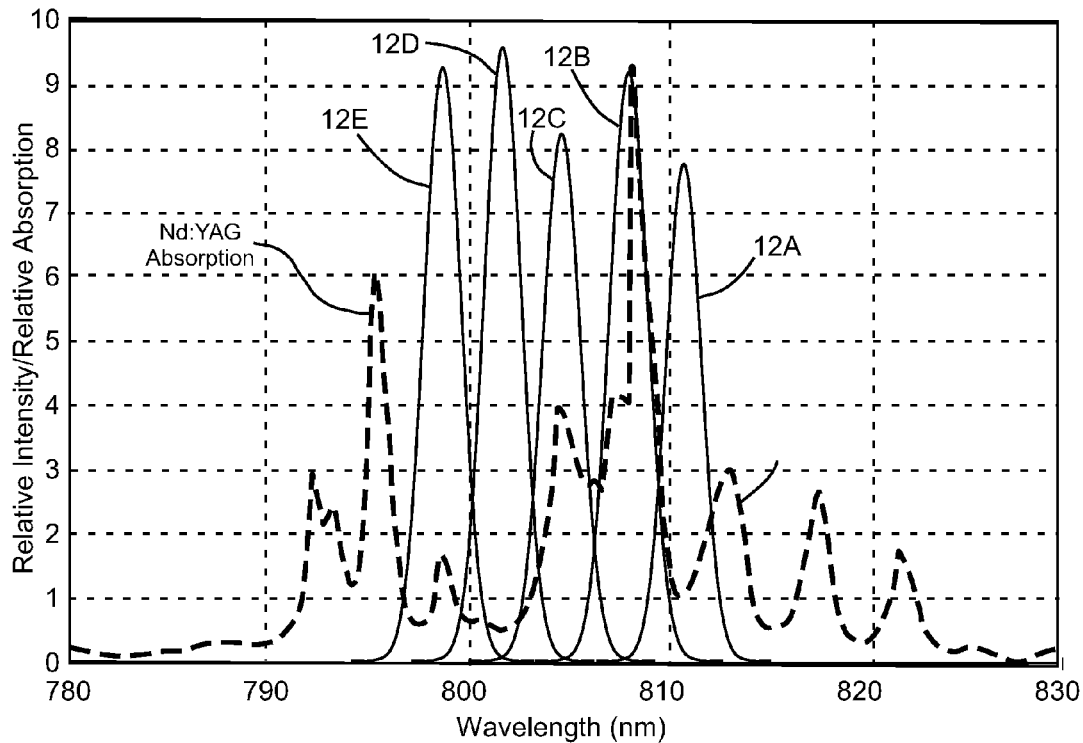
FIG. 7 is a graph schematically illustrating the individual diode-laser bar spectra of FIG. 5 overlaid with the absorption spectrum of Nd:YAG.
FIG. 8 schematically represents one example of a look-up table in accordance with the present invention used to operate the MOSFETs of FIG. 4, responsive to a temperature signal from the sensor of FIGS. 3 and 4, for turning on and off selected ones of the diode-laser bars in the exemplary stack of FIG. 5.

FIG. 7 is a graph schematically illustrating the individual diode-laser bar spectra of FIG. 5 (solid fine curves) overlaid by the Nd:YAG absorption spectrum (bold dashed curve) of FIG. 2. It can be seen from FIG. 7 that the 808 nm primary absorption peak of the absorption band and the 805 nm shoulder portion (secondary peak) of the absorption band only just fit within the emission spectrum of diode-laser bar 12B at the measurement temperature.

FIG. 8 is a representation of a look-up table used in circuit block 42 of the electrical circuitry of FIG. 4 to generate the above-discussed five-bit digital word that determines which of the MOSFETS are turned on (and corresponding diode-lasers turned off) by voltages are applied to the gates of the MOSFETS. The table is produced using the peak-wavelength as a function of temperature calibration curves of FIG. 5. It is determined that two adjacent diode-lasers should be on wherever possible. This is in order to accommodate the close fit of the emission curve of any diode-laser bar emission spectrum with the shouldered 808 nm absorption peak and any temperature measurement inaccuracy due to above-discussed position-related temperature differences between adjacent bars. Having two adjacent diode-laser bars "on" also provides that there is some absorption in the 808-nm peak when switching from one adjacent pair to the next as temperature rises or falls, thereby accommodating a stepwise switching at the predetermined temperature intervals.

In the look up table of FIG. 8, digital zero (0) causes zero voltage to be applied to a MOSFET gate, such that all current flows through the corresponding diode-laser bar, thereby causing the bar to emit laser-radiation. This diode-laser bar "on" condition is indicated by the shaded blocks of the table including the digital zero. A digital one (1) causes a corresponding MOSFET driver to apply voltage V to the corresponding MOSFET gate so that the MOSFET draws sufficient current to effectively short-out the corresponding diode-laser bar, such that the diode-laser bar can not emit radiation.

In the look-up table of FIG. 8, while the signal from the temperature sensor indicates a stack temperature of less than or equal to 25° C. the table will provide digital word 00111 which would enable diode-laser bars 12A and 12B and disable diode-laser bars 12C, 12D, and 12E. If the sensor-signal indicates temperatures greater than 25° C. up to 35° C., the digital word will be 100 μl, whereby diode-laser bars 12B and 12C will be enabled and diode-laser bars 12A, 12D and 12E will be disabled. If the sensor-signal indicates temperatures greater than 35° C. up to 45° C., the digital word will be 11001, whereby diode-laser bars 12C and 12D will be enabled and diode-laser bars 12A, 12B and 12E would be disabled. If the sensor-signal indicates temperatures greater than 45° C. up to 55° C., the digital word will be 11100, whereby diode-laser bars 12D and 12E will be enabled and diode-laser bars 12A, 12B and 12C will be disabled. If the sensor-signal indicates temperatures greater than 55° C., the digital word will be 11110, whereby only diode-laser bar 12E will be enabled and diode-laser bars 12A, 12B, 12C, and 12D will be disabled. The terminology "enabled" and "disabled", as used here, recognizes that a diode-laser bar can only deliver laser radiation (if enabled) when current supply 28 is delivering a current pulse.

It is emphasized here that although the diode-laser bars are supplied with current from a common power supply they can be individually powered independent of the others. This is because any one of the diode-laser bars is only supplied with current when the corresponding MOSFET does not bypass the current around the diode-laser bar, effectively disconnecting the bar from the supply. This is illustrated amply in the example of FIG. 4.

Those skilled in the art will recognize from the description of the present invention provided above that more or less than five diode-laser bars could be included in the inventive stack with different wavelength spacing; with more than one bar at any given wavelength; and with different combinations of diode-laser bars enabled for any given temperature range. The diode-laser bars do not need to be arranged in the stack in increasing or decreasing wavelength order as described. Any such arrangement may be implemented without departing from the spirit and scope of the present invention.

Those skilled in the art will also recognize that while the present invention is described in terms of a digital operation of a multi-wavelength diode-laser bar stack, with some combination of bars fully enabled and others fully disabled, that operating mode should not be considered limiting. It would be possible and may even advantageous to operate the inventive stack in an analog or digital and analog mode with different "on" bars emitting radiation at selectively different power. This could be done, for example, to provide a total emission spectrum to shape to match the spectral shape of a gain-medium absorption peak.

The MOSFET switching system of FIG. 4 lends itself to such analog operation as the drain current of such MOSFETs is dependent on the gate voltage. As the gate voltage is increased the saturated (drain-voltage independent) drain current increases. Increasing the drain current of a MOSFET decreases the current through the corresponding parallel-connected diode-laser bar thereby decreasing the power of radiation emitted by the diode-laser bar. Providing power variation in a bar would require making voltages V applied to the MOSFET gates selectively variable. Because of this, such an analog operation would however require a more extensive calibration and a more complicated MOSFET driving arrangement than that described above for digital operation. Based on the description of the digital driving arrangement provided herein, the design of such an analog driving arrangement would be within the capability of one skilled in the electronic arts.

It should also be noted that while a monitored stack-temperature is used in the above-described embodiment to determine which bars should be enabled and which disabled, it is possible, in theory at least, to use some other monitored value to determine this, while still using a similar switch arrangement for actual operation. Such a value could be laser output power or absorbed pump-power (which would require monitoring pump power onto and out of the gain-medium).

Absent a failure of one or more diode-laser bars or a solid-state laser component, however, changes in laser output power or absorbed pump-power values would normally result from a change in temperature, and accordingly the emission spectrum, of the diode-laser bar stack. If, for example, laser output power were monitored in addition to temperature, the output power could be compared before and after a temperature-dictated switching of diode-laser bars. If the output power did not rise as anticipated corresponding to the diode-laser switching, it would be reasonable to suspect a malfunction of one or more of the diode-laser bars. This would provide input for above discussed additional functions of the microcontroller.

In summary, the present invention is described above in terms of a preferred embodiment. The invention, however, is not limited to the embodiment described and depicted. Rather the invention is limited only to the claims appended hereto.

What is claimed is:

1. A method of optically pumping a gain medium with a stack of diode laser bars, wherein at least some of the diode-laser bars in the stack have a different peak-emission wavelength at different temperatures, with the peak-emission wavelengths being directly dependent on the diode laser bar temperature, said method comprising the step of:
   supplying current to at least one but less than all the bars in the stack to generate laser output for optically pumping the gain medium;
   monitoring the temperature of the stack; and
   in response to the monitored temperature, changing which bars in the stack receive current in order to better match the wavelength emission of the stack to the peak absorption wavelength of the gain medium.

2. The method of claim 1, wherein the gain-medium is Nd:YAG, having a primary peak absorption at a wavelength of about 808 nanometers with a lower secondary peak absorption at a wavelength of about 805 nanometers.

3. The method of claim 1, wherein the diode-laser bar stack is sandwiched between first and second cooling members each having a surface in thermal and electrical contact with the diode-laser bar stack.

4. The method of claim 3 wherein the temperature of the stack is monitored by temperature sensor.

5. The method of claim 4, wherein the temperature sensor is embedded in one of the cooling members proximate the surface thereof in thermal and electrical contact with the diode-laser bar stack.

6. The method of claim 1 wherein said step of changing which bars in the stack receive current is performed by a switching arrangement cooperative with a current supply and arranged for selectively turning on or off any one or more of the diode laser bars from the current supply independent of the others.

7. A method of optically pumping a gain medium with a stack of diode laser bars, with at least one of the diode laser bars in the stack having a peak-emission wavelength that is significantly different from the peak-emission wavelength of at least one of the other bars, said method comprising;
supplying current to at least one but less than all the bars in the stack to generate laser output for optically pumping the gain medium; and
selectively turning on or off any one or more of the diode laser bars from the current supply independent of the others in order to better match the wavelength emission of the stack to the peak absorption wavelength of the gain medium.

8. The method of claim 7, wherein the gain-medium is Nd:YAG, having a primary peak absorption at a wavelength of about 808 nanometers with a lower secondary peak absorption at a wavelength of about 805 nanometers.

9. The method of claim 7 further including the step of monitoring the temperature of the stack and wherein the step of selectively turning on or off the diode laser bars is responsive to the monitored temperature.

10. The method of claim 9, wherein the diode-laser bar stack is sandwiched between first and second cooling members each having a surface in thermal and electrical contact with the diode-laser bar stack.

11. The method of claim 10 wherein the temperature of the stack is monitored by temperature sensor.

12. The method of claim 11, wherein the temperature sensor is embedded in one of the cooling members proximate the surface thereof in thermal and electrical contact with the diode-laser bar stack.

* * * * *